United States Patent
Kang et al.

(10) Patent No.: US 10,566,456 B2
(45) Date of Patent: Feb. 18, 2020

(54) THIN FILM TRANSISTOR, METHOD FOR FABRICATING THE SAME, AND OLED DISPLAY PANEL

(71) Applicants: BOE Technology Group Co., Ltd., Beijing (CN); Ordos Yuansheng Optoelectronics Co., Ltd., Inner Mongolia (CN)

(72) Inventors: Feng Kang, Beijing (CN); Nini Bai, Beijing (CN); Liangliang Liu, Beijing (CN); Liang Tang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/979,635

(22) Filed: May 15, 2018

(65) Prior Publication Data
US 2019/0027611 A1 Jan. 24, 2019

(30) Foreign Application Priority Data
Jul. 21, 2017 (CN) .......................... 2017 1 0602821

(51) Int. Cl.
*H01L 29/786* (2006.01)
*H01L 27/12* (2006.01)
*H01L 29/66* (2006.01)
*H01L 27/32* (2006.01)

(52) U.S. Cl.
CPC ...... *H01L 29/78621* (2013.01); *H01L 27/127* (2013.01); *H01L 27/1222* (2013.01); *H01L 27/1255* (2013.01); *H01L 27/1259* (2013.01); *H01L 27/1288* (2013.01); *H01L 29/66492* (2013.01); *H01L 29/66757* (2013.01); *H01L 29/78675* (2013.01); *H01L 27/3262* (2013.01)

(58) Field of Classification Search
CPC .......... H01L 27/1222; H01L 29/78621; H01L 27/1255; H01L 27/1259; H01L 27/127; H01L 29/78675; H01L 29/66757; H01L 29/66492; H01L 27/1288; H01L 27/3262
See application file for complete search history.

(56) References Cited

U.S. PATENT DOCUMENTS

| 9,318,577 B2 * | 4/2016 | Koezuka | H01L 27/1288 |
| 2004/0252250 A1 * | 12/2004 | Yang | G02F 1/136277 349/43 |
| 2010/0087045 A1 * | 4/2010 | Shimomura | H01L 21/76254 438/458 |

* cited by examiner

*Primary Examiner* — Latanya N Crawford
(74) *Attorney, Agent, or Firm* — Arent Fox LLP; Michael Fainberg

(57) ABSTRACT

The disclosure discloses a thin film transistor, a method for fabricating the same, and an OLED display panel. The method for fabricating a thin film transistor includes: forming a poly-silicon layer and a gate insulation layer on a base substrate in that order; forming a pattern of a gate above the base substrate with the gate insulation layer in a patterning process; doping the base substrate with the pattern of the gate for the first time; forming a pattern of first photoresist on the base substrate doped for the first time, using a mask for forming the pattern of the gate, wherein the pattern of the first photoresist covers the pattern of the gate and an area for forming a lightly doped drain area; and doping the base substrate with the pattern of the first photoresist for the second time to form a pattern of an active layer.

9 Claims, 4 Drawing Sheets

THIN FILM TRANSISTOR, METHOD FOR FABRICATING THE SAME, AND OLED DISPLAY PANEL

CROSS-REFERENCE TO RELATED APPLICATION

This Application claims priority to Chinese Patent Application No. 201710602821.6, filed on Jul. 21, 2017, the content of which is incorporated by reference in the entirety.

TECHNICAL FIELD

The disclosure relates to the field of thin film transistors, and particularly to a thin film transistor, a method for fabricating the same, and an Organic Light Emitting Diode (OLED) display panel.

DESCRIPTION OF THE RELATED ART

A PMOS transistor is generally applied to an Active-Matrix Organic Light Emitting Diode (AMOLED), and leakage current thereof is significantly improved over that in an NMOS transistor. However in order to improve disadvantageous Mura at a low grayscale, a larger Sub-threshold Swing (SS) is required due to the characteristic of the PMOS transistor, but the leakage current in the PMOS transistor may be increased due to the larger SS.

If the leakage current in the PMOS transistor is increased, then there may be a larger number of bright dark dots, and when γ is written into a module, there is so high brightness at a low grayscale that γ cannot be written successfully, so it is very important to improve the leakage current in the PMOS transistor in a process thereof. The leakage current can be improved in effect in the related art in an additional Lightly Doped Drain (LDD) area process.

However, an LDD area in the AMOLED device is generally formed using an additional set of masks for forming the LDD, thus increasing a fabrication cost thereof.

SUMMARY

Embodiments of the disclosure provide a thin film transistor, a method for fabricating the same, and an OLED display panel.

In one aspect, embodiments of the disclosure provide a method for fabricating a thin film transistor, the method including forming a poly-silicon layer and a gate insulation layer on a base substrate in that order, wherein the method further includes: forming a pattern of a gate above the base substrate with the gate insulation layer in a patterning process; doping the base substrate with the pattern of the gate for the first time; forming a pattern of first photoresist on the base substrate doped for the first time, using a mask for forming the pattern of the gate, wherein the pattern of the first photoresist covers the pattern of the gate and an area for forming a lightly doped drain area; and doping the base substrate with the pattern of the first photoresist for the second time to form a pattern of an active layer.

In some embodiments, in the method above for fabricating the thin film transistor according to the embodiments of the disclosure, forming the pattern of the first photoresist on the base substrate doped for the first time, using the mask for forming the pattern of the gate includes: forming a first photoresist layer on the base substrate doped for the first time, using the mask for forming the pattern of the gate; adjusting the amount of exposure on the first photoresist layer to form the pattern of the first photoresist.

In some embodiments, in the method above for fabricating the thin film transistor according to the embodiments of the disclosure, forming the pattern of the gate above the base substrate with the gate insulation layer in the patterning process includes: forming a gate metal layer above the base substrate with the gate insulation layer; forming a second photoresist layer above the base substrate with the gate metal layer; exposing and developing the second photoresist layer using a mask to form an entirely reserved area for the second photoresist and a completely removed area for the second photoresist, wherein the entirely reserved area for the second photoresist corresponds to an area for forming the gate; and etching the gate metal layer corresponding to the completely removed area for the second photoresist to form the pattern of the gate.

In some embodiments, in the method above for fabricating the thin film transistor according to the embodiments of the disclosure, the gate metal layer corresponding to the completely removed area for the second photoresist is etched through dry etching.

In some embodiments, in the method above for fabricating the thin film transistor according to the embodiments of the disclosure, after the pattern of the gate is formed, the method further includes: stripping the second photoresist layer corresponding to the entirely reserved area for the second photoresist.

In some embodiments, in the method above for fabricating the thin film transistor according to the embodiments of the disclosure, forming the pattern of the first photoresist on the base substrate doped for the first time, using the mask for forming the pattern of the gate includes: forming a first photoresist layer on the base substrate doped for the first time; and exposing and developing the first photoresist layer using the mask for forming the pattern of the gate to form an entirely reserved area for the first photoresist and a completely removed area for the first photoresist, wherein the entirely reserved area for the first photoresist corresponds to the area of the gate and the area for forming the lightly doped drain area.

In some embodiments, in the method above for fabricating the thin film transistor according to the embodiments of the disclosure, after the pattern of the active layer is formed, the method further includes: stripping the first photoresist layer corresponding to the entirely reserved area for the first photoresist.

In some embodiments, in the method above for fabricating the thin film transistor according to the embodiments of the disclosure, the base substrate is doped lightly for the first time, and heavily for the second time.

In another aspect, embodiments of the disclosure further provide a thin film transistor including the thin film transistor fabricated using the method above for fabricating the thin film transistor according to the embodiments of the disclosure.

In still another aspect, embodiments of the disclosure further provide an OLED display panel including the thin film transistor above according to the embodiments of the disclosure.

DETAILED DESCRIPTION OF THE EMBODIMENTS

Figure 1:
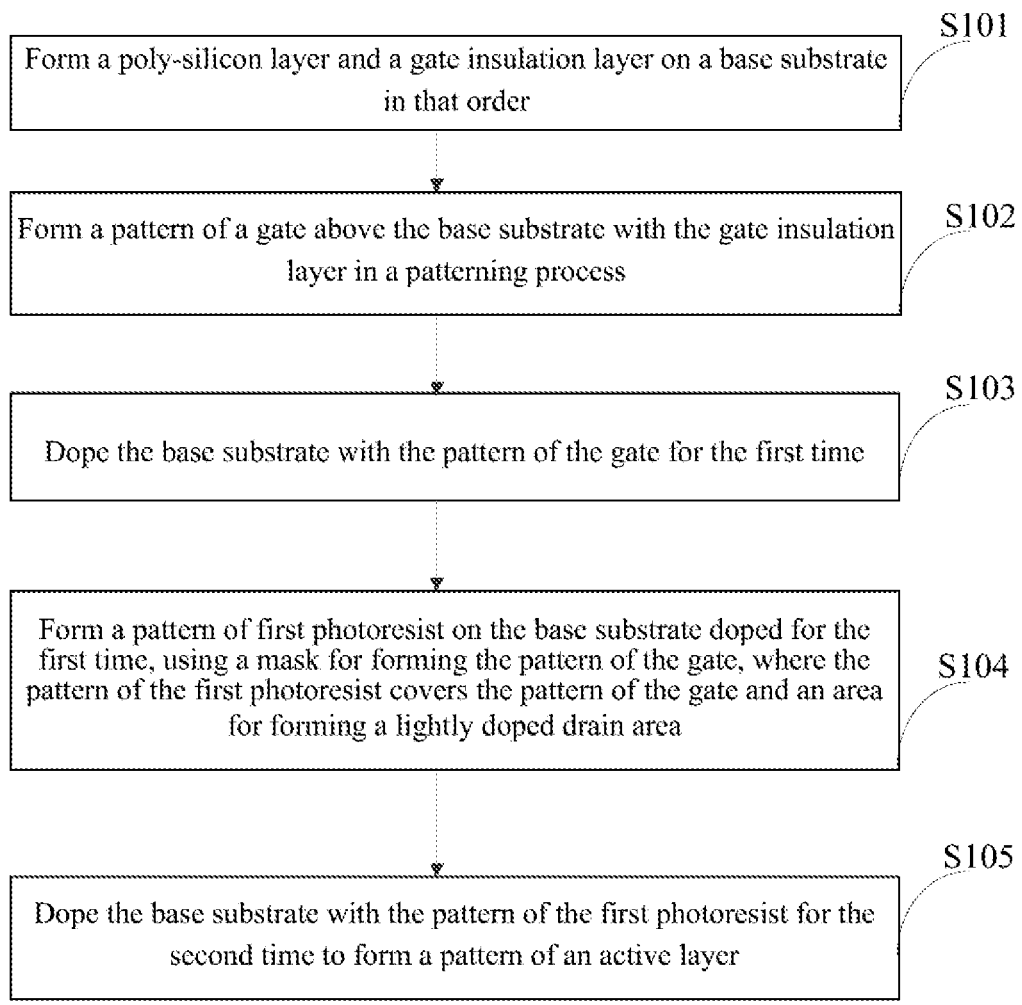
FIG. 1 is a schematic flow chart of a method for fabricating a thin film transistor according to embodiments of the disclosure.

In order to make the objects, technical solutions, and advantages of the disclosure more apparent, the disclosure will be described below in further details with reference to the drawings, and apparently the embodiments to be described are only a part but not all of the embodiments of the disclosure. Based upon the embodiments here of the disclosure, all the other embodiments which can occur to those ordinarily skilled in the art without any inventive effort shall fall into the scope of the disclosure as claimed.

The embodiments of the disclosure provide a thin film transistor, a method for fabricating the same, and an OLED display panel so as to form an LDD area using a mask for forming a pattern of a gate in the thin film transistor to thereby save a fabrication cost thereof.

Implementations of the thin film transistor, the method for fabricating the same, and the OLED display panel according to the embodiments of the disclosure will be described below in details with reference to the drawings.

The thicknesses and shapes of respective layers in the drawings are not intended to reflect any real proportion, but only intended to illustrate the disclosure of the disclosure.

As illustrated in FIG. 1, a method for fabricating a thin film transistor according to the embodiments of the disclosure includes following operations.

S101 is to form a poly-silicon layer and a gate insulation layer on a base substrate in that order.

S102 is to form a pattern of a gate above the base substrate with the gate insulation layer in a patterning process.

S103 is to dope the base substrate with the pattern of the gate for the first time.

S104 is to form a pattern of first photoresist on the base substrate doped for the first time, using a mask for forming the pattern of the gate, where the pattern of the first photoresist covers the pattern of the gate and an area for forming a lightly doped drain area.

S105 is to dope the base substrate with the pattern of the first photoresist for the second time to form a pattern of an active layer.

In the method above for fabricating the thin film transistor according to the embodiments of the disclosure, the pattern of the gate is formed above the base substrate with the gate insulation layer in the patterning process, and then the base substrate with the pattern of the gate is doped for the first time using the pattern of the gate as a mask, so that the poly-silicon layer which is not covered with the gate is doped; and furthermore the pattern of the first photoresist is formed above the pattern of the gate using the mask for forming the pattern of the gate, and then the base substrate is doped for the second time using the pattern of the first photoresist as a mask, so that the LDD area is formed in the area which is only doped for the first time. Accordingly in the embodiments of the disclosure, the LDD area of the thin film transistor is formed by doping the base substrate twice using only one mask, thus saving a fabrication cost thereof.

In some embodiments, in the method above for fabricating the thin film transistor according to the embodiments of the disclosure, the operation S104 of forming the pattern of the first photoresist on the base substrate doped for the first time, using the mask for forming the pattern of the gate includes: forming a first photoresist layer on the base substrate doped for the first time, using the mask for forming the pattern of the gate; adjusting the amount of exposure on the first photoresist layer to form the pattern of the first photoresist.

In some embodiments of the disclosure, the active layer is doped twice using the mask for forming the pattern of the gate, and before the active layer is doped for the second time, the first photoresist layer is formed using the mask for forming the pattern of the gate, and the amount of exposure on the first photoresist layer is adjusted to thereby form the pattern of the first photoresist, so that the first photoresist covers the pattern of the gate and the area for forming the lightly doped drain area, and the base substrate is doped for the second time using the pattern of the first photoresist as a mask. Here the pattern of the photoresist is formed by reducing the amount of exposure accordingly so that the first photoresist around a light-shielding area of the mask is not developed away due to illumination with light, so that the first photoresist around the light-shielding area is reserved. Here a width of the area for forming the lightly doped drain area can be formed by adjusting the amount of exposure. In some embodiments, the width of the area for forming the lightly doped drain area can be adjusted to 0.6 to 0.8 μm. Accordingly in the method above for fabricating the thin film transistor according to the embodiments of the disclosure, the width of the LDD area can be adjusted in different scenarios without increasing the number of masks, thus saving a cost thereof.

In some embodiments, in the method above for fabricating the thin film transistor according to the embodiments of the disclosure, the operation S102 of forming the pattern of the gate above the base substrate with the gate insulation layer in the patterning process includes: forming a gate metal layer above the base substrate with the gate insulation layer; forming a second photoresist layer above the base substrate with the gate metal layer; exposing and developing the second photoresist layer using a mask to form an entirely reserved area for the second photoresist and a completely removed area for the second photoresist, where the entirely reserved area for the second photoresist corresponds to an area of the pattern of the gate; and etching the gate metal layer corresponding to the completely removed area for the second photoresist to form the pattern of the gate. In some embodiments, the mask for forming the pattern of the gate is a mask including only a completely light-shielding area and a completely light-transmitting area, and the pattern of the gate is formed using the mask.

After the pattern of the gate is formed, the base substrate with the pattern of the gate is doped for the first time, so in the embodiments of the disclosure, the base substrate is doped for the first time by forming a first doping area on the base substrate using the pattern of the gate as a mask, where the first doping area is another area at the poly-silicon layer than the area corresponding to the gate. Accordingly the base substrate is doped for the first time using ions at a low concentration, and thus lightly doped.

Figure 2:
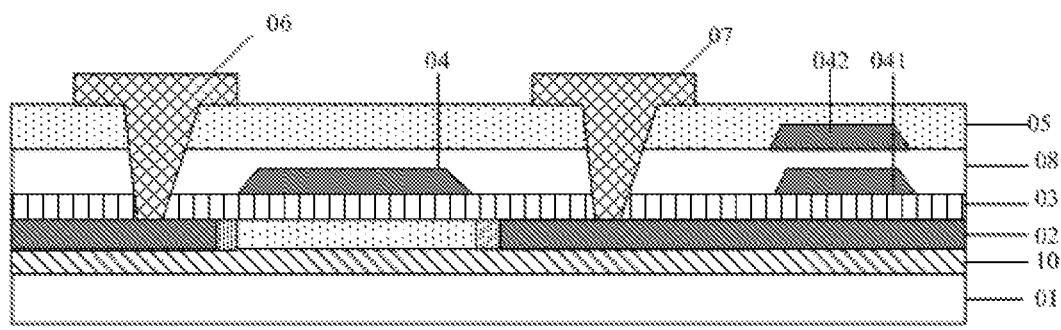
FIG. 2 is a schematic structural diagram of a thin film transistor according to the embodiments of the disclosure.

In some embodiments, in the method above for fabricating the thin film transistor according to the embodiments of the disclosure, the gate metal layer corresponding to the completely removed area for the second photoresist is etched through dry etching. In some embodiments, in the structure of the thin film transistor as illustrated in FIG. 2, the thin film transistor includes: a base substrate 01; an active layer 02 and a gate insulation layer 03 arranged above the base substrate 01; a gate 04, a first insulation layer 08, a source 06, and a drain 07 arranged above the gate insulation layer 03; a first gate 041 arranged at the same layer as the gate 04; and a second gate 042 and a second insulation layer 05 arranged between the first insulation layer 08 and the source 06; where the first gate 041 and the second gate 042 constitute a storage capacitor. Here in order to enable the storage capacitor to be constituted between the first gate 041 and the second gate 042, a slope angle of the first gate 041 is less than 30°. When the pattern of the gate is formed in a wet etching process, the slope angle of the gate or the first gate is approximately 70°, and in order to guarantee the capacitance of the storage capacitor, the thickness of the first insulation layer between the first gate and the second gate is less than the thickness of the first gate or the gate, so that the first insulation layer at the edge of the first gate may be broken, thus resulting in such a short-circuit of metal between the first gate and the second gate that would lead to display abnormality. Accordingly in order to avoid the storage capacitor in the thin film transistor in an OLED display device from being short-circuited, the pattern of the gate is formed in a dry etching process in the embodiments of the disclosure.

In some embodiments, in the method above for fabricating the thin film transistor according to the embodiments of the disclosure, in order to facilitate formation of a subsequent layer, after the pattern of the gate is formed, the method further includes: stripping the second photoresist layer corresponding to the entirely reserved area for the second photoresist.

In some embodiments, in the method above for fabricating the thin film transistor according to the embodiments of the disclosure, the operation S104 of forming the pattern of the first photoresist on the base substrate doped for the first time, using the mask for forming the pattern of the gate includes: forming a first photoresist layer on the base substrate doped for the first time; and exposing and developing the first photoresist layer using the mask for forming the pattern of the gate to form an entirely reserved area for the first photoresist and a completely removed area for the first photoresist, where the entirely reserved area for the first photoresist corresponds to the area of the gate and the area for forming the lightly doped drain area. In some embodiments of the disclosure, the mask for forming the pattern of the gate includes a light-transmitting area and a light-shielding area. The amount of exposure is adjusted as appropriate so that the pattern of the first photoresist formed using the mask covers at least the area of the gate and an area around the gate. Accordingly in the embodiments of the disclosure, the pattern of the gate is formed using the mask, the pattern of the first photoresist is formed using the mask by adjusting the amount of exposure, and the poly-silicon layer is doped respectively for the first time using the pattern of the gate, and for the second time using the pattern of the first photoresist, so that the LDD area is formed only in the area doped for the first time, thus saving a cost of fabricating the thin film transistor. Since the pattern of the first photoresist is formed by adjusting the amount of exposure, the width of the LDD area can be further adjusted. Furthermore the pattern of the first photoresist is formed using the mask for forming the pattern of the gate, thus further saving the fabrication cost.

In some embodiments, in the method above for fabricating the thin film transistor according to the embodiments of the disclosure, in order to facilitate formation of a subsequent layer, after the pattern of the active layer is formed, the method further includes: stripping the first photoresist layer corresponding to the entirely reserved area for the first photoresist.

In some embodiments, in the method above for fabricating the thin film transistor according to the embodiments of the disclosure, the base substrate is doped lightly for the first time, and heavily for the second time. In some embodiments, the concentration of ions at which the base substrate is doped for the first time is less than the concentration of ions at which the base substrate is doped for the second time.

Based upon the same inventive concept, the embodiments of the disclosure further provide a thin film transistor including the thin film transistor fabricated using the method above for fabricating the thin film transistor according to the embodiments of the disclosure.

A process of the method for fabricating the thin film transistor according to the embodiments of the disclosure will be described below in a particular embodiment thereof.

Figure 3A:
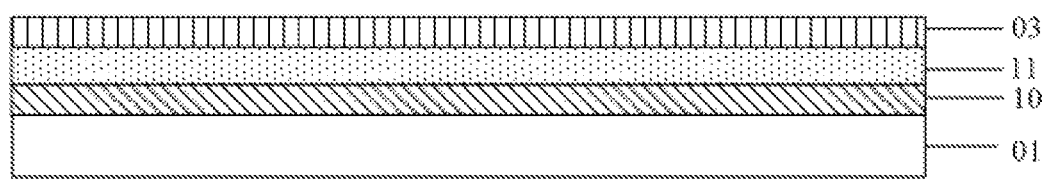
FIG. 3A to FIG. 3G are respective schematic structural diagrams after respective operations in the method for fabricating the thin film transistor according to the embodiments of the disclosure.

The first operation is to form a buffer layer 10, a poly-silicon layer 11, and a gate insulation layer 03 above a base substrate 01 as illustrated in FIG. 3A.

Here the material of the base substrate can be glass, quartz, silicon, an organic polymer, etc., and the material of the buffer layer can be silicon oxide, silicon nitride, or a combination thereof.

Figure 3B:
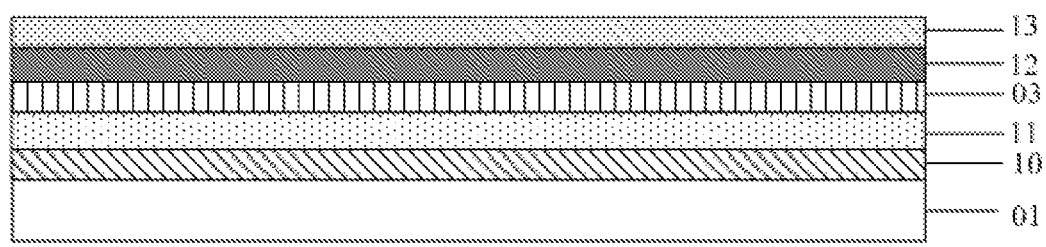

The second operation is to form a gate metal layer 12 and a second photoresist layer 13 above a pattern of the gate insulation layer 03 as illustrated in FIG. 3B.

Here the material of the gate can be molybdenum, aluminum, titanium, copper, or another material.

Figure 3C:
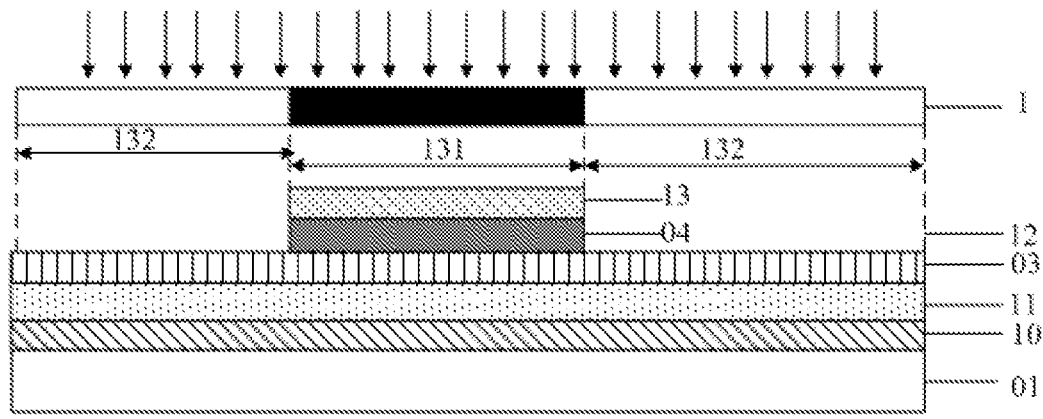

The third operation is to expose and develop the second photoresist layer 13 using a mask 1 to form an entirely reserved area for the second photoresist 131 and a completely removed area for the second photoresist 132, where the entirely reserved area for the second photoresist corresponds to an area of a pattern of the gate; and to etch the gate metal layer corresponding to the completely removed area for the second photoresist to form the pattern of the gate 04, as illustrated in FIG. 3C.

Figure 3D:
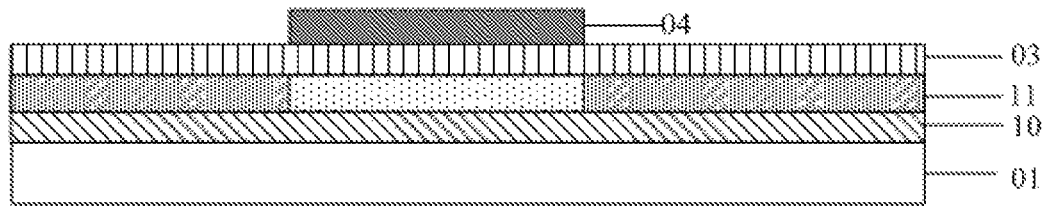

The fourth operation is to strip the second photoresist layer 13 corresponding to the entirely reserved area for the second photoresist, and to lightly dope the base substrate, as illustrated in FIG. 3D.

Figure 3E:
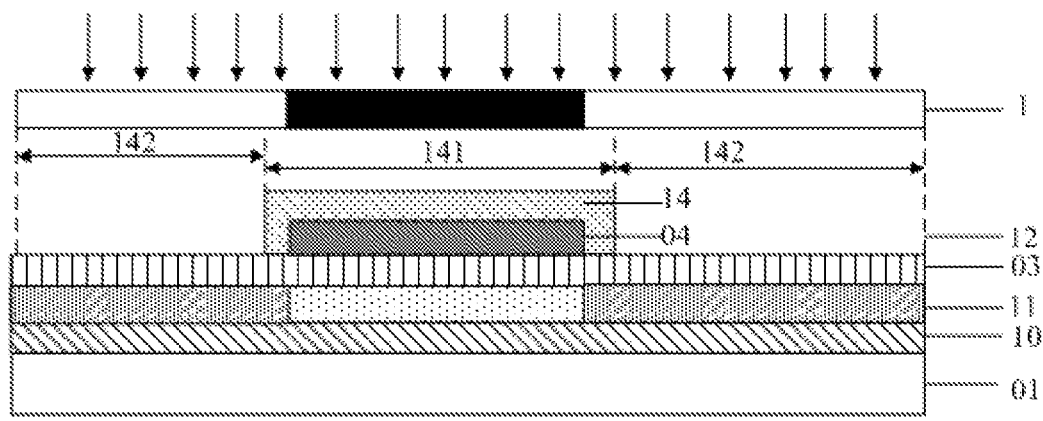

The fifth operation is to form a first photoresist layer 14 above the gate, to expose the first photoresist layer 14 using the mask 1, to adjust the amount of exposure on the first photoresist, and to form an entirely reserved area for the first photoresist 141 and a completely removed area for the first photoresist 142 through development, where the entirely reserved area for the first photoresist 141 corresponds to the area of the gate and an area for forming a lightly doped drain area, as illustrated in FIG. 3E.

Figure 3F:
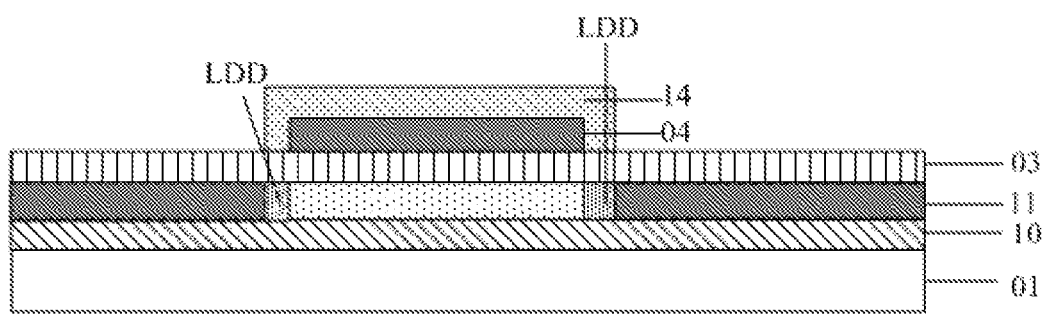

The sixth operation is to dope the base substrate as illustrated in FIG. 3E for the second time to thereby form the LDD area P, so that the poly-silicon layer is formed with an active layer, as illustrated in FIG. 3F.

Figure 3G:
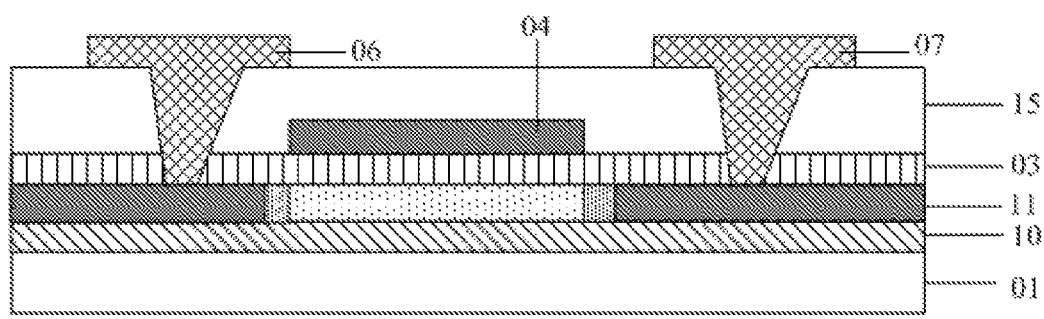

The seventh operation is to strip the first photoresist layer corresponding to the entirely reserved area for the first photoresist, and to form patterns of an interlayer insulation layer 15, a source 06, and a drain 07 above the pattern of the gate, as illustrated in FIG. 3G.

Based upon the same inventive concept, the embodiments of the disclosure further provide an OLED display panel including the thin film transistor above according to the embodiments of the disclosure.

The embodiments of the disclosure provide a thin film transistor, a method for fabricating the same, and an OLED display panel, and the method includes: forming a poly-silicon layer and a gate insulation layer on a base substrate in that order; forming a pattern of a gate above the base substrate with the gate insulation layer in a patterning process; doping the base substrate with the pattern of the gate for the first time; forming a pattern of first photoresist on the base substrate doped for the first time, using a mask for forming the pattern of the gate, where the pattern of the first photoresist covers the pattern of the gate and an area for forming a lightly doped drain area; and doping the base substrate with the pattern of the first photoresist for the second time to form a pattern of an active layer. Apparently in the embodiments of the disclosure, the base substrate is doped for the first time using the pattern of the gate as a mask, and then the pattern of the first photoresist is formed using the mask with the pattern of the gate, and the base substrate is doped for the second time using the pattern of the first photoresist as a mask, so that the LDD area is such an area at the poly-silicon layer that is only doped for the first time. Accordingly in the embodiments of the disclosure, the LDD area can be formed using only the mask for forming the pattern of the gate, to thereby save a cost of fabricating the thin film transistor.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A method for fabricating a thin film transistor, comprising forming a poly-silicon layer and a gate insulation layer on a base substrate in that order, wherein the method further comprises:
    forming a pattern of a gate above the base substrate with the gate insulation layer in a patterning process;
    doping the base substrate with the pattern of the gate for a first time;
    forming a pattern of first photoresist on the base substrate doped for the first time, using a mask for forming the pattern of the gate, wherein the pattern of the first photoresist covers the pattern of the gate and an area for forming a lightly doped drain area; and
    doping the base substrate with the pattern of the first photoresist for a second time to form a pattern of an active layer;
    wherein forming the pattern of the gate above the base substrate with the gate insulation layer in the patterning process comprises:
    forming a gate metal layer above the base substrate with the gate insulation layer;
    forming a second photoresist layer above the base substrate with the gate metal layer;
    exposing and developing the second photoresist layer using a mask to form an entirely reserved area for the second photoresist and a completely removed area for the second photoresist, wherein the entirely reserved area for the second photoresist corresponds to an area for forming the gate; and
    etching the gate metal layer corresponding to the completely removed area for the second photoresist to form the pattern of the gate.

2. The method according to claim 1, wherein forming the pattern of the first photoresist on the base substrate doped for the first time, using the mask for forming the pattern of the gate comprises:
    forming a first photoresist layer on the base substrate doped for the first time, using the mask for forming the pattern of the gate;
    adjusting an amount of exposure on the first photoresist layer to form the pattern of the first photoresist.

3. The method according to claim 1, wherein:
    the gate metal layer corresponding to the completely removed area for the second photoresist is etched through dry etching.

4. The method according to claim 1, wherein after the pattern of the gate is formed, the method further comprises:
    stripping the second photoresist layer corresponding to the entirely reserved area for the second photoresist.

5. The method according to claim 4, wherein forming the pattern of the first photoresist on the base substrate doped for the first time, using the mask for forming the pattern of the gate comprises:
    forming a first photoresist layer on the base substrate doped for the first time; and
    exposing and developing the first photoresist layer using the mask for forming the pattern of the gate to form an entirely reserved area for the first photoresist and a completely removed area for the first photoresist, wherein the entirely reserved area for the first photoresist corresponds to the area of the gate and the area for forming the lightly doped drain area.

6. The method according to claim 5, wherein after the pattern of the active layer is formed, the method further comprises:
    stripping the first photoresist layer corresponding to the entirely reserved area for the first photoresist.

7. The method according to claim 1, wherein the base substrate is doped lightly for the first time, and heavily for the second time.

8. A thin film transistor, comprising the thin film transistor fabricated using the method for fabricating the thin film transistor according to claim 1.

9. An Organic Light Emitting Diode (OLED) display panel, comprising the thin film transistor according to claim 8.

* * * * *